(12) United States Patent
Miwa

(10) Patent No.: US 11,950,329 B2
(45) Date of Patent: Apr. 2, 2024

(54) HOLDING DEVICE

(71) Applicant: NGK SPARK PLUG CO., LTD., Aichi (JP)

(72) Inventor: Kaname Miwa, Nagoya (JP)

(73) Assignee: NITERRA CO., LTD., Nagoya (JP)

(*) Notice: Subject to any disclaimer, the term of this patent is extended or adjusted under 35 U.S.C. 154(b) by 893 days.

(21) Appl. No.: 16/969,703

(22) PCT Filed: Feb. 12, 2019

(86) PCT No.: PCT/JP2019/004782
§ 371 (c)(1),
(2) Date: Aug. 13, 2020

(87) PCT Pub. No.: WO2019/159862
PCT Pub. Date: Aug. 22, 2019

(65) Prior Publication Data
US 2021/0007183 A1  Jan. 7, 2021

(30) Foreign Application Priority Data
Feb. 16, 2018  (JP) .................. 2018-025589

(51) Int. Cl.
*B23Q 3/15* (2006.01)
*H01L 21/31* (2006.01)
(Continued)

(52) U.S. Cl.
CPC .............. *H05B 3/03* (2013.01); *B23Q 3/15* (2013.01); *H01L 21/31* (2013.01); *H02N 13/00* (2013.01);
(Continued)

(58) Field of Classification Search
None
See application file for complete search history.

(56) References Cited

U.S. PATENT DOCUMENTS

2006/0272774 A1  12/2006  Maehara et al.
2009/0277895 A1  11/2009  Komatsu et al.
(Continued)

FOREIGN PATENT DOCUMENTS

JP  2006-352114 A  12/2006
JP  2009-182139 A  8/2009
(Continued)

OTHER PUBLICATIONS

International Search Report dated May 21, 2019 by the International Searching Authority in counterpart International Patent Application No. PCT/JP2019/004782.
(Continued)

*Primary Examiner* — Joseph M. Pelham
(74) *Attorney, Agent, or Firm* — Sughrue Mion, PLLC

(57) ABSTRACT

A holding device including a plate-shaped member, a base member, a plurality of heater electrodes disposed in the plate-shaped member, a plurality of electricity supply terminals, a bonding portion, and insulating members. The holding device holds an object on the surface of the plate-shaped member. The plurality of electricity supply terminals disposed in the holding device include N individual electricity supply terminals (N is an integer of 2 or more) electrically connected to respective N heater electrodes of the plurality of heater electrodes, and a common electricity supply terminal electrically connected to all the N heater electrodes. The N individual electricity supply terminals are received in one terminal hole in which the common electricity supply terminal is not received and are insulated from one another by an insulating member. The common electricity supply terminal is received in another terminal hole in which the individual electricity supply terminals are not received.

8 Claims, 7 Drawing Sheets

(51) Int. Cl.
*H02N 13/00* (2006.01)
*H05B 3/03* (2006.01)
*H05B 3/06* (2006.01)
*H05B 3/74* (2006.01)
*H05B 3/68* (2006.01)

(52) U.S. Cl.
CPC ............... *H05B 3/06* (2013.01); *H05B 3/748* (2013.01); *H05B 3/68* (2013.01); *H05B 2203/016* (2013.01)

(56) References Cited

U.S. PATENT DOCUMENTS

| | | |
|---|---|---|
| 2010/0243606 A1 | 9/2010 | Koshimizu et al. |
| 2011/0092072 A1 | 4/2011 | Singh et al. |
| 2014/0045337 A1 | 2/2014 | Singh et al. |
| 2014/0047705 A1 | 2/2014 | Singh et al. |
| 2014/0096909 A1 | 4/2014 | Singh et al. |
| 2016/0027678 A1 | 1/2016 | Parkhe et al. |
| 2016/0126125 A1 | 5/2016 | Okugawa et al. |
| 2016/0300741 A1 | 10/2016 | Singh et al. |
| 2017/0229327 A1 | 8/2017 | Singh et al. |
| 2017/0345668 A1 | 11/2017 | Takebayashi et al. |
| 2019/0088517 A1 | 3/2019 | Kosakai et al. |
| 2020/0006095 A1* | 1/2020 | Miwa .................. H01L 21/3065 |
| 2021/0090930 A1* | 3/2021 | Miwa .................... H01L 21/683 |
| 2021/0274599 A1* | 9/2021 | Uematsu ........... H01L 21/67103 |

FOREIGN PATENT DOCUMENTS

| | | |
|---|---|---|
| JP | 2013-89850 A | 5/2013 |
| JP | 2016-076646 A | 5/2016 |
| JP | 2016-129183 A | 7/2016 |
| JP | 2017-157617 A | 9/2017 |
| JP | 2017-157855 A | 9/2017 |
| JP | 2017-201669 A | 11/2017 |
| JP | 2017-228649 A | 12/2017 |
| KR | 10-2009-0099070 A | 9/2009 |
| KR | 10-2010-0108303 A | 10/2010 |
| KR | 10-2012-0116490 A | 10/2012 |
| KR | 10-2016-0092035 A | 8/2016 |
| WO | 2017/115758 A1 | 7/2017 |

OTHER PUBLICATIONS

Office Action dated Jan. 25, 2023 by the Korean Intellectual Property Office in Korean Patent Application No. 10-2020-7022941.

Communication dated Aug. 31, 2020 issued by the Taiwan Intellectual Property Office in corresponding Taiwan Application No. 108104906.

Office Action dated May 24, 2023, issued by Korean Patent Office in Korean Patent Application No. 10-2023-7006307.

* cited by examiner

US 11,950,329 B2

HOLDING DEVICE

CROSS-REFERENCE TO RELATED APPLICATIONS

This application is a National Phase Entry of PCT International Application No. PCT/JP2019/004782 filed Feb. 12, 2019, which claims priority to Japanese Patent Application No. 2018-025589 filed Feb. 16, 2018.

TECHNICAL FIELD

The technique disclosed in the present description relates to a holding device for holding an object.

BACKGROUND ART

For example, an electrostatic chuck is used as a holding device for holding a wafer during production of a semiconductor. The electrostatic chuck is formed of, for example, a ceramic and includes a plate-shaped member having an approximately flat surface (hereinafter referred to as an "attracting surface") approximately perpendicular to a prescribed direction (hereinafter referred to as a "first direction"); a base member formed of, for example, a metal; a bonding portion which bonds the plate-shaped member to the base member; and a chuck electrode disposed inside the plate-shaped member. The electrostatic chuck utilizes electrostatic attraction generated when a voltage is applied to the chuck electrode to thereby attract and hold a wafer on the attracting surface of the plate-shaped member.

Since the accuracy of processing (such as film formation and etching) performed on the wafer held on the attracting surface of the electrostatic chuck may decrease unless the temperature of the wafer is maintained at a prescribed temperature, the electrostatic chuck needs to have the ability to control the distribution of temperature in the wafer. Therefore, the electrostatic chuck has a heater electrode disposed in the plate-shaped member, and electricity supply terminals electrically connected to the heater electrodes. The electricity supply terminals are received in terminal holes, which are through holes formed in the base member and the bonding portion. In the electrostatic chuck configured as described above, when a voltage is applied from a power source through the electricity supply terminals to the heater electrode, the heater electrode generates heat to heat the plate-shaped member, whereby the distribution of temperature on the attracting surface of the plate-shaped member is controlled (the distribution of temperature in the wafer held on the attracting surface is controlled).

The electrostatic chuck may include a plurality of heater electrodes disposed in the plate-shaped member. In this structure, by controlling the voltages applied to the heater electrodes individually, the amounts of heat generated by the heater electrodes can be controlled individually. Therefore, the distribution of temperature on the attracting surface of the plate-shaped member can be controlled finely.

In the case where a plurality of heater electrodes are disposed in the plate-shaped member, a structure in which a plurality of electricity supply terminals are received in one terminal hole may be employed in order to reduce the number of terminal holes for receiving the electricity supply terminals electrically connected to the heater electrodes (see, for example, Patent Documents 1 and 2).

PRIOR ART DOCUMENTS

Patent Documents

Patent Document 1: Japanese Patent Application Laid-Open (kokai) No. 2016-76646
Patent Document 2: International Publication No. WO2017/115758

SUMMARY OF THE INVENTION

Problem to be Solved by the Invention

In the conventional structure, a combination of a plurality of electricity supply terminals which have large potential differences thereamong when voltages are applied to the heater electrodes may be received in one terminal hole. For example, in a structure in which two electrode terminals electrically connected to one heater electrode are received in one terminal hole, the potential difference between the two electricity supply terminals received in the one terminal hole can be large. Also in a structure in which an electricity supply terminal on a reference potential side (e.g., a ground side) which is electrically connected to one heater electrode and an electricity supply terminal on the side opposite to the reference electrode side which is connected to another heater electrode are received in one terminal hole, the potential difference between the two electricity supply terminals received in the one terminal hole can be large. Therefore, in the above conventional structure, to increase the insulation distance between electricity supply terminals received in one terminal hole, it is necessary to increase the physical distance between the electricity supply terminals or to dispose a large insulating member between the electricity supply terminals, and this may cause an increase in the size of the terminal holes.

Since portions of the plate-shaped member which overlap the terminal holes as viewed in the first direction differ from the remaining portion of the plate-shaped member in terms of conditions regarding heat transfer between the plate-shaped member and the base member, these overlapping portions tend to act as temperature singularities (regions in which temperature changes more greatly than their surroundings). Therefore, as the size of the terminal holes increases, the temperature singularities in the plate-shaped member are increased in size, and the controllability of the distribution of temperature on the attracting surface of the plate-shaped member (and thus the controllability of the distribution of temperature in the wafer held by the electrostatic chuck) may decrease. As described above, in the case where a plurality of electricity supply terminals are received in one terminal hole, the conventional electrostatic chuck structure raises a problem of possible deterioration of the controllability of the distribution of temperature on the attracting surface of the plate-shaped member (and the controllability of the distribution of temperature in the wafer held by the electrostatic chuck).

This problem is a common problem that occurs not only in the electrostatic chuck which holds a wafer using electrostatic attraction but also in a general holding device which includes a plate-shaped member, a base member, a bonding portion which bonds the plate-shaped member to the base member, a plurality of heater electrodes disposed in the plate-shaped member, and a plurality of electricity supply terminals electrically connected to the heater electrodes and holds an object on the surface of the plate-shaped member.

The present description discloses a technique capable of solving the above problem.

Means for Solving the Problems

The technique disclosed in the present description can be embodied, for example, in the following modes.

(1) A holding device disclosed in the present description comprises a plate-shaped member having an approximately flat first surface approximately orthogonal to a first direction and a second surface opposite to the first surface; a base member having a third surface and a fourth surface opposite to the third surface, the base member being disposed such that the third surface faces the second surface of the plate-shaped member, the base member having a plurality of first through holes extending from the third surface to the fourth surface; a plurality of heater electrodes disposed in the plate-shaped member and each formed from a resistance heating element; a plurality of electricity supply terminals electrically connected to the respective heater electrodes; a bonding portion disposed between the second surface of the plate-shaped member and the third surface of the base member to bond the plate-shaped member and the base member together, the bonding portion having a plurality of second through holes which communicate with the respective first through holes of the base member and form, in cooperation with the first through holes, terminal holes for receiving the electricity supply terminals; and insulating members received in the respective terminal holes. The holding device holds an object on the first surface of the plate-shaped member. The plurality of electricity supply terminals include N individual electricity supply terminals (N is an integer of 2 or more) electrically connected to respective N heater electrodes of the plurality of heater electrodes, and a common electricity supply terminal electrically connected to all the N heater electrodes. The N individual electricity supply terminals are received in a first one of the terminal holes and are insulated from one another by one of the insulating members, the first one of the terminal holes not receiving the common electricity supply terminal. The common electricity supply terminal is received in a second one of the terminal holes, the second one of the terminal holes not receiving the individual electricity supply terminals. When voltages are applied to the heater electrodes, the potential of the common electricity supply terminal is maintained at a predetermined reference potential (e.g., a ground potential), but the potentials of the individual electricity supply terminals are set to values corresponding to the amounts of heat to be generated by the respective heater electrodes electrically connected to the individual electricity supply terminals. Therefore, although the differences in potential between the common electricity supply terminal and the individual electricity supply terminals are relatively large, the differences in potential between the individual electricity supply terminals are significantly smaller than the differences in potential between the common electricity supply terminal and the individual electricity supply terminals. In the present holding device, the N individual electricity supply terminals (N is an integer of 2 or more) electrically connected to the respective N heater electrodes are received in the first one of the terminal holes in which the common electricity supply terminal is not received and are insulated from one another by one of the insulating members, and the common electricity supply terminal is received in the second one of the terminal holes in which the individual electricity supply terminals are not received. Therefore, in the present holding device, the difference in potential between electricity supply terminals received in one terminal hole can be reduced. As a result, the physical distance between the electricity supply terminals can be reduced, and the size of the insulating members disposed between the electricity supply terminals can be reduced, so that the size of the terminal holes can be reduced. Therefore, in the present holding device, although the structure in which a plurality of electricity supply terminals are received in one terminal hole is employed, the size of the terminal holes can be reduced, so that the temperature singularities in the plate-shaped member can be reduced in size. Therefore, it is possible to improve the controllability of the distribution of temperature on the first surface of the plate-shaped member (and the controllability of the distribution of temperature of an object held by the holding device).

(2) The above-described holding device may be configured such that at least part of the plate-shaped member is virtually divided into a plurality of segments arranged in directions orthogonal to the first direction, the plurality of heater electrodes are disposed in the respective segments, and N segments of the plurality of segments in which the respective N heater electrodes are disposed form one continuous upper level segment. In the present holding device, control of the distribution of the temperature on the first surface of the plate-shaped member on a segment-by-segment basis (i.e., finer temperature distribution control) and also control of the distribution of the temperature on the first surface of the plate-shaped member on an upper level segment-by-upper level segment basis (i.e., coarse temperature distribution control) can be achieved using the same structure, so that the convenience of the holding device can be improved.

(3) The above-described holding device may be configured such that, when the holding device is viewed in the first direction, the area of each segment in a first portion of the plate-shaped member is smaller than the area of each segment in a second portion of the plate-shaped member which is closer to the center of the plate-shaped member than the first portion. Portions of the plate-shaped member which overlap the terminal holes when viewed in the first direction tend to act as temperature singularities. Therefore, in the portions of the plate-shaped member which overlap the terminal holes when viewed in the first direction (and their peripheral portions), the heater electrodes require a special design which differs from the design of the heater electrodes in other portions. Therefore, it is preferable that the shapes of the terminal holes are the same or close to one another, and accordingly, it is preferable that the numbers of electricity supply terminals received in the terminal holes are the same or close to one another. The first portion of the plate-shaped member is more easily affected by the temperature of the outside than the second portion which is closer to the center point of the plate-shaped member than the first portion. Therefore, to achieve finer temperature distribution control, it is preferable to reduce the areas of the upper level segments in the first portion. In the present holding device, the area of each segment in the first portion of the plate-shaped member is smaller than the area of each segment in the second portion. Therefore, the areas of the upper level segments in the first portion can be reduced while the number of segments included in one upper level segment in the first portion is set to be the same as or close to the number of segments included in one upper level segment in the second portion (i.e., the number of individual electricity supply terminals received in a terminal hole corresponding to one upper level segment in the first portion is set to be the same as or close to the number of individual electricity supply terminals received in a terminal hole corresponding to one upper level segment in the second portion). In the present holding device, since the numbers electricity supply terminals received in the terminal holes are the same or close to one another, the shapes of the terminal holes can be the same or close to one another. By reducing the areas of the upper level segments in the first portion, the controllability of the distribution of the temperature on the first surface of the plate-shaped member (and the controllability of the distribution of the temperature of the object held by the holding device) can be further improved.

(4) The above-described holding device may be configured such that the segments included in the one upper level segment have respective surfaces included in the first surface; a first heater electrode of the plurality heater electrodes is disposed in a first one of the segments included in the one upper level segment; a second heater electrode of the plurality heater electrodes is disposed in a second one of the segments included in the one upper level segment; and the amount of heat generated by the first heater electrode per unit area of the surface of the first one of the segments is approximately the same as the amount of heat generated by the second heater electrode per unit area of the surface of the second one of the segments. In the present holding device, the temperatures of regions of the first surface which belong to two segments included in one upper level segment can be approximately the same, and the uniformity of the temperature distribution in regions of the first surface which belong to each upper level segment can be improved.

(5) The above-described holding device may be configured such that, in the one upper level segment including the N segments having the respective surfaces included in the first surface, the amounts of heat generated by the heater electrodes disposed in the respective N segments per unit area of the respective surfaces of the N segments are approximately the same. In the present holding device, the temperatures of regions of the first surface which belong to N segments (i.e., all the segments) included in one upper level segment can be approximately the same, and the uniformity of the temperature distribution in regions of the first surface which belong to each upper level segment can be effectively improved.

(6) The above-described holding device may further comprise a power source which can be switched between a first state in which individually set voltages are applied to the respective N individual electricity supply terminals and a second state in which the same voltage is applied to the N individual electricity supply terminals. In the present holding device, the amounts of heat generated by the N heater electrodes can be controlled independently, and the amounts of heat generated by the N heater electrodes can be controlled collectively, so that the convenience of the holding device can be further improved.

(7) The above-described holding device may be configured such that the plurality of electricity supply terminals include a plurality of the common electricity supply terminals received in the second one of the terminal holes. In the present holding device, the difference between the size of the terminal hole which receives the N individual electricity supply terminals and the size of the terminal hole which receives the plurality of common electricity supply terminal can be reduced, so that an increase in temperature variations on the first surface of the plate-shaped member due to the differences in size between the terminal holes can be prevented. The portions of the first surface of the plate-shaped member which overlap the terminal holes when viewed in the first direction tend to act as temperature singularities. Therefore, in the portions of the plate-shaped member which overlap the terminal holes when viewed in the first direction (and their peripheral portions), the heater electrodes require a special design which differs from the design of the heater electrodes in other portions. Therefore, it is preferable that the shapes of the terminal holes are the same or close to one another, and, accordingly, it is preferable that the numbers of electricity supply terminals received in the terminal holes are the same or close to one another. In the present holding device, the shape of the terminal hole which receives the N individual electricity supply terminals can be the same as or close to the shape of the terminal hole which receives the plurality of common electricity supply terminals. Therefore, when the holding device is viewed in the first direction, the special shape of the heater electrodes in a portion of the plate-shaped member which overlaps the terminal hole receiving the N individual electricity supply terminals can be the same as or close to the special shape of the heater electrodes in a portion of the plate-shaped member which overlaps the terminal hole receiving the plurality of common electricity supply terminals. Therefore, it is possible to easily improve the uniformity of the distribution of the temperature on the first surface of the plate-shaped member.

(8) The above-described holding device may be configured such that the plurality of electricity supply terminals include the common electricity supply terminals which are received in the second one of the terminal holes and the number of which is N. In the present holding device, the difference between the size of the terminal hole which receives the N individual electricity supply terminals and the size of the terminal hole which receives the N common electricity supply terminals can be effectively reduced, so that an increase in temperature variations on the first surface of the plate-shaped member due to the difference in size between the terminal holes can be effectively prevented. In the present holding device, the shape of the terminal hole which receives the N individual electricity supply terminals can be more easily set to be the same as or close to the shape of the terminal hole which receives the N common electricity supply terminals. Therefore, when the holding device is viewed in the first direction, the special shape of the heater electrodes in the portion of the plate-shaped member which overlaps the terminal hole receiving the N individual electricity supply terminals can be the same as or close to the special shape of the heater electrodes in the portion of the plate-shaped member which overlaps the terminal hole receiving the N common electricity supply terminals. Therefore, it is possible to more easily improve the uniformity of the distribution of the temperature on the first surface of the plate-shaped member.

The technique disclosed in the present description can be embodied in various forms such as a holding device, an electrostatic chuck, a vacuum chuck, and methods for producing these devices.

MODES FOR CARRYING OUT THE INVENTION

A. First Embodiment

A-1. Structure of Electrostatic Chuck 100

Figure 1:
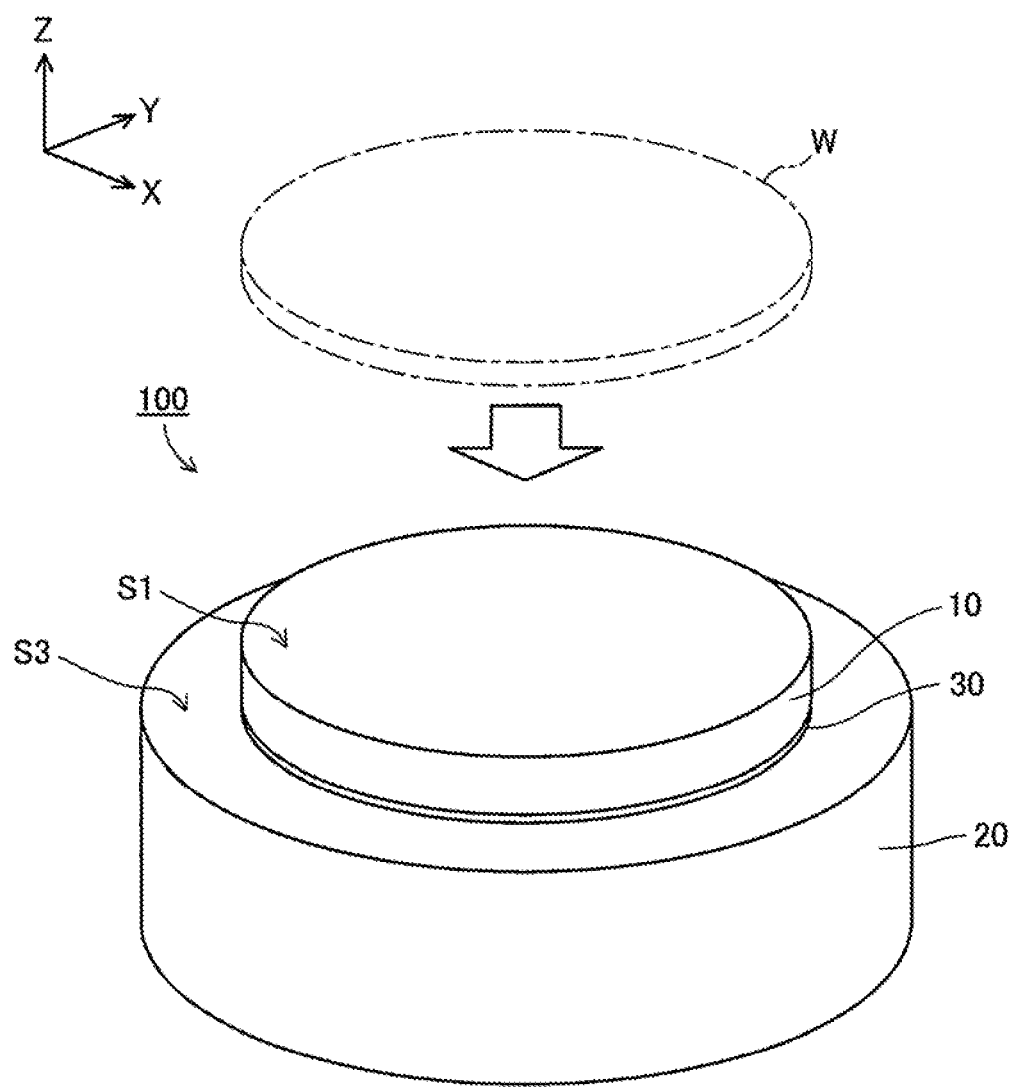
FIG. 1 is a perspective view schematically showing an external structure of an electrostatic chuck 100 according to a first embodiment.
Figure 2:
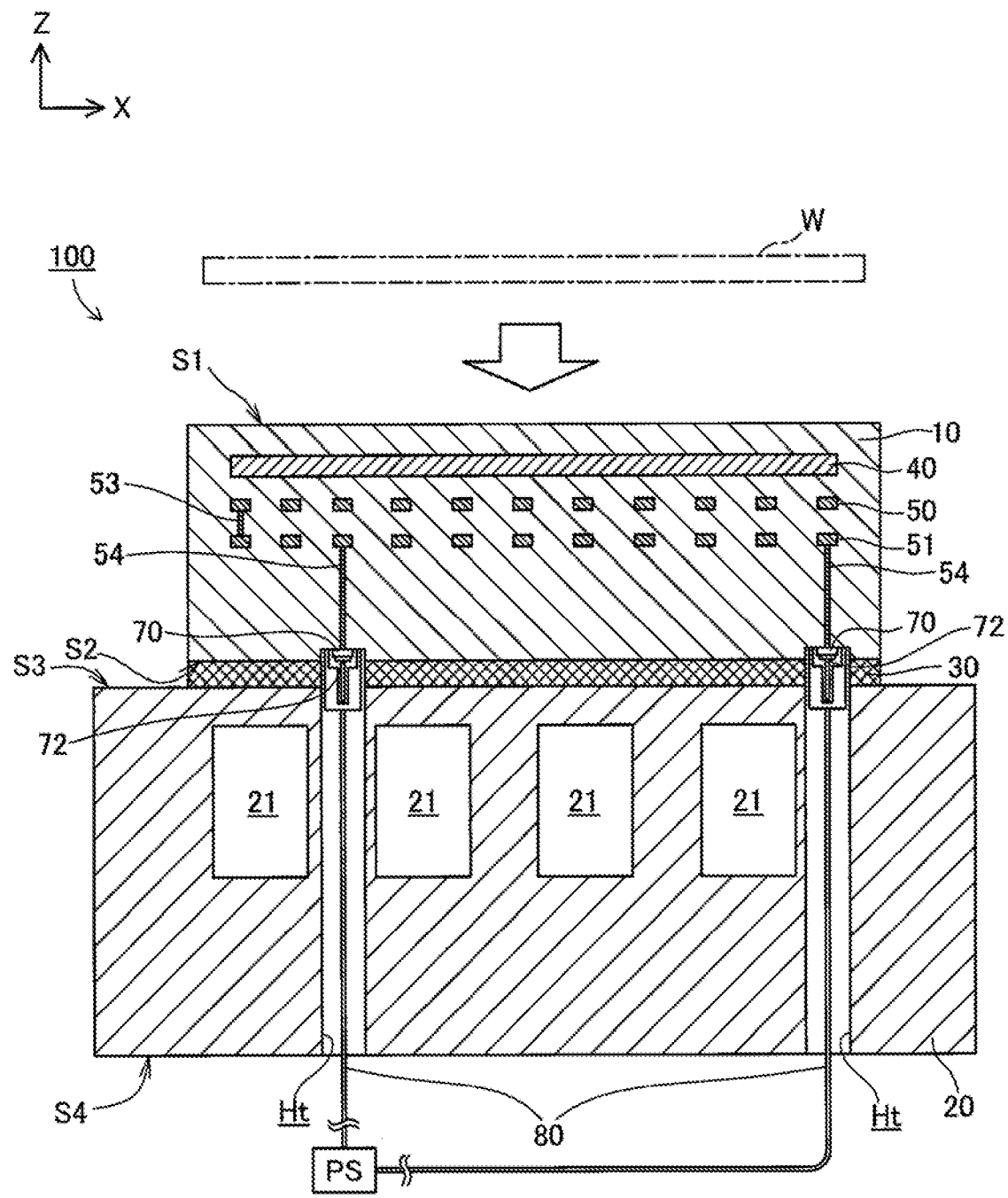
FIG. 2 is an illustration schematically showing an XZ cross-sectional structure of the electrostatic chuck 100 according to the first embodiment.
Figure 3:
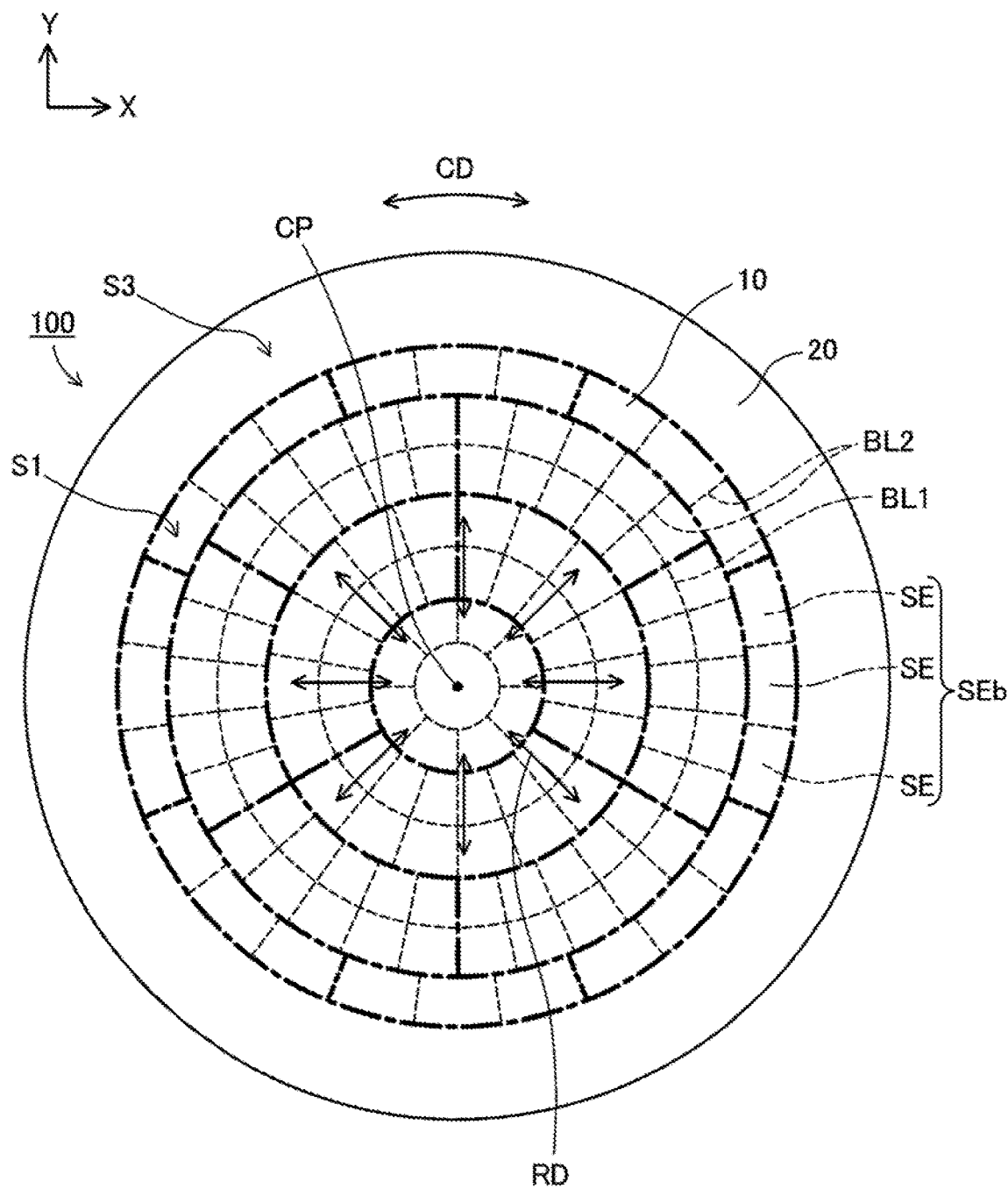
FIG. 3 is an illustration schematically showing an XY plane (upper surface) structure of the electrostatic chuck 100 according to the first embodiment.

FIG. 1 is a perspective view schematically showing an external structure of an electrostatic chuck 100 according to a first embodiment, and FIG. 2 is an illustration schematically showing an XZ cross-sectional structure of the electrostatic chuck 100 according to the first embodiment. FIG. 3 is an illustration schematically showing an XY plane (upper surface) structure of the electrostatic chuck 100 according to the first embodiment. Mutually orthogonal X, Y, and Z axes for designating directions are shown in these figures. In the present description, a positive Z-axis direction is referred to as an upward direction, and a negative Z-axis direction is referred to as a downward direction, for the sake of convenience. However, in actuality, the electrostatic chuck 100 may be oriented differently.

The electrostatic chuck 100 is a device which attracts and holds an object (e.g., a wafer W) by electrostatic attraction and is used to fix the wafer W, for example, in a vacuum chamber of a semiconductor manufacturing apparatus. The electrostatic chuck 100 includes a plate-shaped member 10 and a base member 20 which are arranged in a prescribed arrangement direction (the vertical direction (the Z axis direction) in the present embodiment). The plate-shaped member 10 and the base member 20 are arranged such that the lower surface S2 of the plate-shaped member 10 (see FIG. 2) and the upper surface S3 of the base member 20 face each other in the arrangement direction.

The plate-shaped member 10 has an approximately circular flat upper surface S1 (hereinafter referred to as an "attracting surface") approximately orthogonal to the arrangement direction (the Z axis direction) and is formed of, for example, a ceramic (such as alumina or aluminum nitride). The diameter of the plate-shaped member 10 is, for example, about 50 mm to about 500 mm (generally about 200 mm to about 350 mm), and the thickness of the plate-shaped member 10 is, for example, about 1 mm to about 10 mm. The attracting surface S1 of the plate-shaped member 10 corresponds to the first surface in the claims, and the lower surface S2 of the plate-shaped member 10 corresponds to the second surface in the claims. The Z axis direction corresponds to the first direction in the claims. In the present description, directions orthogonal to the Z axis direction are referred to as "plane directions." As shown in FIG. 3, the plane directions include a "circumferential direction CD" about the center point CP of the attracting surface S1 and "radial directions RD" orthogonal to the circumferential direction CD.

As shown in FIG. 2, a chuck electrode 40 formed of an electrically conductive material (such as tungsten, molybdenum, or platinum) is disposed inside the plate-shaped member 10. As viewed in the Z axis direction, the chuck electrode 40 has, for example, an approximately circular shape. When a voltage is applied from a power source (not shown) to the chuck electrode 40, electrostatic attraction is generated, and the wafer W is attracted and fixed to the attracting surface S1 of the plate-shaped member 10 through the electrostatic attraction.

A heater electrode layer 50, a driver 51, and various vias 53 and 54 which are formed of a conductive material (such as tungsten, molybdenum, or platinum) are disposed inside the plate-shaped member 10. The driver 51 and the vias 53 and 54 are used to supply electricity to the heater electrode layer 50. In the present embodiment, the heater electrode layer 50 is disposed below the chuck electrode 40, and the driver 51 is disposed below the heater electrode layer 50. The structures of them will be described later in detail. The plate-shaped member 10 having the above-described structure can be produced, for example, by preparing a plurality of ceramic green sheets; subjecting the ceramic green sheets to various processing steps including, for example, forming via holes in prescribed ceramic green sheets, filling the via holes with a metallized paste, and printing the metallized paste; subjecting these ceramic green sheets to thermocompression bonding and machining such as cutting; and then firing the resulting ceramic green sheets.

The base member 20 is a plate-shaped member having a circular plane, for example, having the same diameter as the plate-shaped member 10 or a larger diameter than the plate-shaped member 10 and is formed of, for example, a metal (such as aluminum or an aluminum alloy). The diameter of the base member 20 is, for example, about 220 mm to about 550 mm (generally 220 mm to 350 mm), and the thickness of the base member 20 is, for example, about 20 mm to about 40 mm. The upper surface S3 of the base member 20 corresponds to the third surface in the claims, and the lower surface S4 of the base member 20 corresponds to the fourth surface in the claims.

The base member 20 is joined to the plate-shaped member 10 through a bonding portion 30 disposed between the lower surface S2 of the plate-shaped member 10 and the upper surface S3 of the base member 20. The bonding portion 30 is formed of an adhesive such as a silicone-based resin, an acrylic-based resin, or an epoxy-based resin. The thickness of the bonding portion 30 is, for example, about 0.1 mm to about 1 mm.

A coolant channel 21 is formed inside the base member 20. When a coolant (such as a fluorine-based inert liquid or water) is circulated through the coolant channel 21, the base member 20 is cooled, and the plate-shaped member 10 is cooled by heat transfer (heat absorption) between the base member 20 and the plate-shaped member 10 through the bonding layer 30. The wafer W held on the attracting surface S1 of the plate-shaped member 10 is thereby cooled. As a result, control of the temperature distribution in the wafer W is realized.

A-2. Structure of Heater Electrode Layer 50 and Structure for Supplying Electricity to Heater Electrode Layer 50

Figure 4:
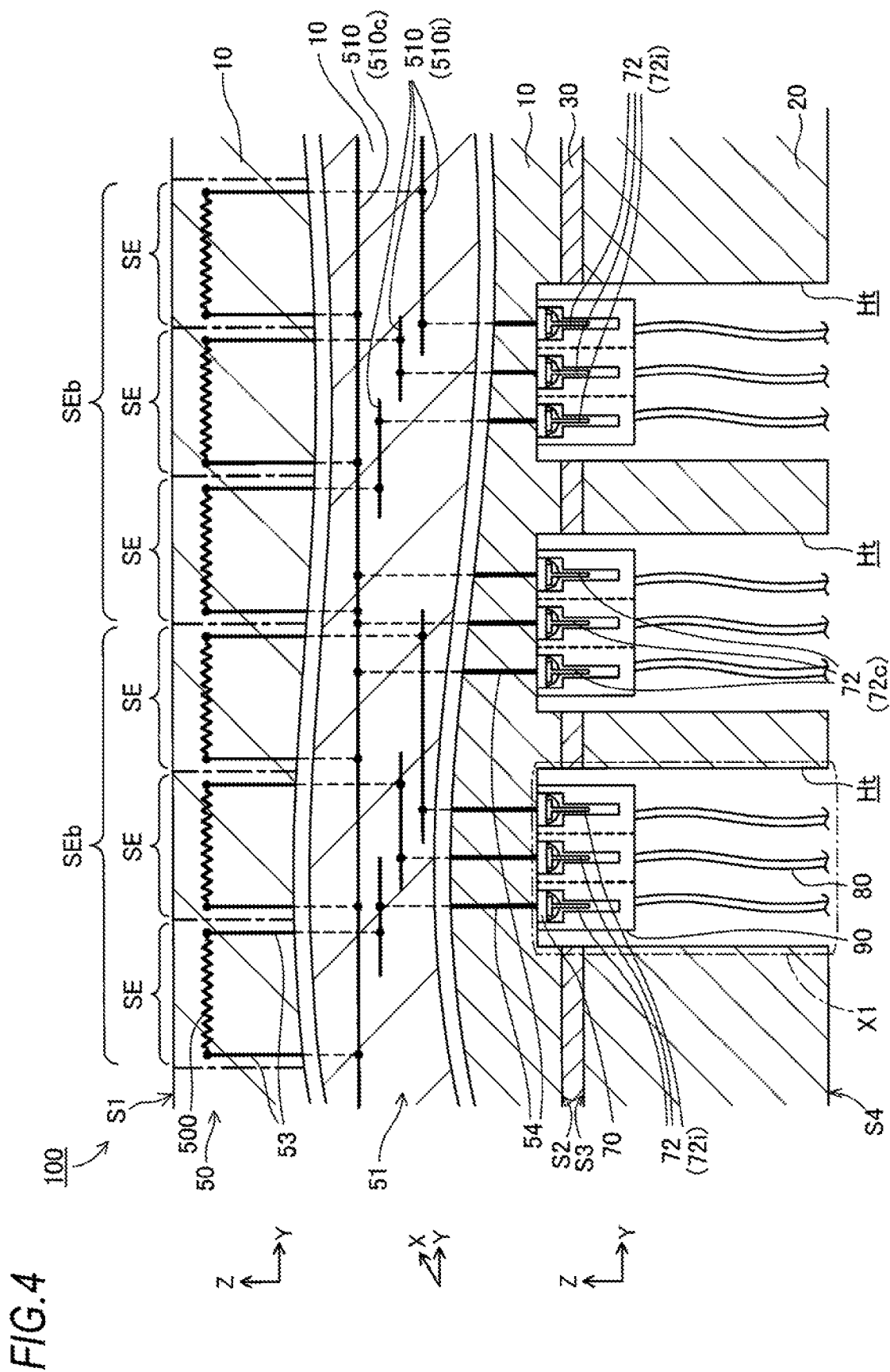
FIG. 4 is an illustration schematically showing a heater electrode layer 50 and a structure for supplying electricity to the heater electrode layer 50.
Figure 5:
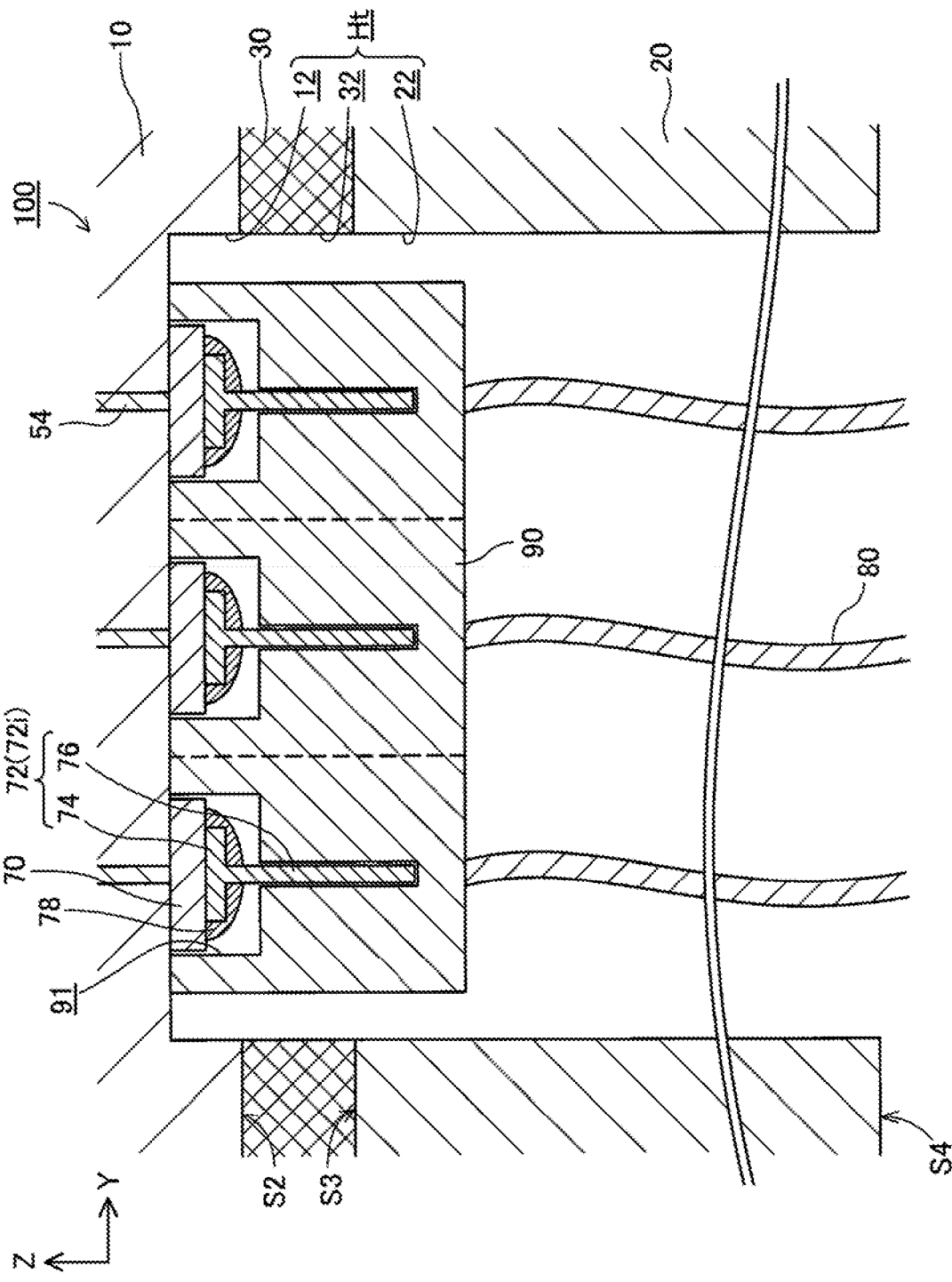
FIG. 5 is an enlarged illustration of a YZ cross-sectional structure of a peripheral portion (a portion X1 in FIG. 4) of a terminal hole Ht.

Next, the structure of the heater electrode layer 50 and a structure for supplying electricity to the heater electrode layer 50 will be described in detail. As described above, the heater electrode layer 50, the driver 51, and the vias 53 and 54 are disposed in the plate-shaped member 10, and the driver 51 and the vias 53 and 54 are used to supply electricity to the heater electrode layer 50. Additional structures (such as electricity supply terminals 72 received in terminal holes Ht described later) for supplying electricity to the heater electrode layer 50 are provided in the electrostatic chuck 100. FIG. 4 is an illustration schematically showing the heater electrode layer 50 and the structure for supplying electricity to the heater electrode layer 50. A YZ cross-sectional structure of part of the heater electrode layer 50 disposed in the plate-shaped member 10 is schematically shown in the upper part of FIG. 4, and an XY cross-sectional structure of part of the driver 51 disposed in the plate-shaped member 10 is schematically shown in the middle part of FIG. 4. A YZ cross-sectional structure of the additional structures for supplying electricity to the heater electrode layer 50 is schematically shown in the lower part of FIG. 4. FIG. 5 is an enlarged illustration showing a YZ cross-sectional structure of a peripheral portion (a portion X1 in FIG. 4) of a terminal hole Ht described later.

As shown in FIG. 3, in the electrostatic chuck 100 of the present embodiment, a plurality of virtual portions, i.e., segments SE (shown by broken lines in FIG. 3), arranged in plane directions (directions orthogonal to the Z axis direction) are set in the plate-shaped member 10. More specifically, as viewed in the Z axis direction, the plate-shaped member 10 is divided into a plurality of virtual annular regions by a plurality of concentric circular first boundary lines BL1 with their centers at the center point CP of the attracting surface S1 (but only a region containing the center point CP is a circular region). Each annular region is divided by a plurality of second boundary lines BL2 extending in radial directions RD into segments SE which are a plurality of virtual regions arranged in the circumferential direction CD.

In the electrostatic chuck 100 of the present embodiment, upper level segments SEb (shown by dot-dash lines in FIG. 3), i.e., a plurality of virtual portions arranged in plane directions, are set in the plate-shaped member 10. Each of the upper level segments SEb includes N (an integer of 2 or more) segments SE arranged continuously (in cluster) when viewed in the Z axis direction. Specifically, the N segments SE form one continuous upper level segment SEb. The one continuous upper level segment SEb means that, when it is viewed in the Z axis direction, a segment SE not included in this upper level segment SEb is not disposed between any two segments SE included in this upper level segment SEb. In the example shown in FIG. 3, each upper level segment SEb includes three, nine, ten, or twelve segments SE (i.e., the value of N is 3, 9, 10, or 12).

In the upper part of FIG. 4, six segments SE and two upper level segments SEb set in the plate-shaped member 10 are shown as an illustrative example. Each upper level segment SEb includes three segments SE arranged continuously when viewed in the Z axis direction (i.e., the value of N is 3).

As shown in the upper part of FIG. 4, the heater electrode layer 50 includes a plurality of heater electrodes 500. Each of the plurality of heater electrodes 500 included in the heater electrode layer 50 is disposed in a corresponding one of the plurality of segments SE set in the plate-shaped member 10. Specifically, in the electrostatic chuck 100 of the present embodiment, one heater electrode 500 is disposed in each of the plurality of segments SE. In other words, in the plate-shaped member 10, a portion in which one heater electrode 500 is disposed (a portion heated mainly by that heater electrode 500) serves as one segment SE. When the electrostatic chuck 100 is viewed in the Z axis direction, a boundary line between two segments SE located adjacent to each other in the radial or circumferential direction is a line located at the midpoint between a heater electrode 500 disposed in one of the segments SE and a heater electrode 500 disposed in the other segment SE. Since each of the upper level segments SEb shown in FIG. 4 includes three segments SE, three heater electrodes 500 are disposed in each upper level segment SEb.

Figure 6:
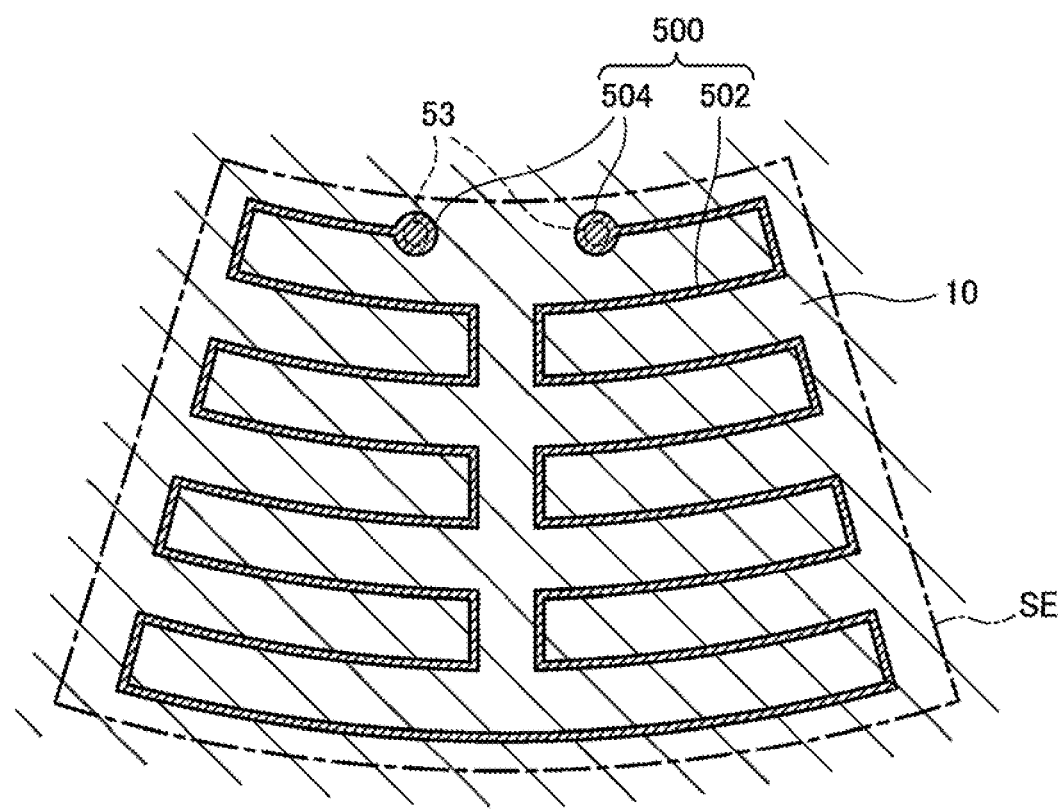
FIG. 6 is an illustration schematically showing an XY cross-sectional structure of one heater electrode 500 disposed in one segment SE.

FIG. 6 is an illustration schematically showing an XY cross-sectional structure of one heater electrode 500 disposed in one segment SE. As shown in FIG. 6, the heater electrode 500 includes a heater line portion 502 which is a resistance heating element having a line shape as viewed in the Z axis direction, and heater pad portions 504 connected to opposite ends of the heater line portion 502. In the present embodiment, when viewed in the Z axis direction, the heater line portion 502 is shaped so as to extend through all positions in the segment SE as uniform as possible. The heater electrodes 500 disposed in other segments SE have the same structure.

As shown in the middle part of FIG. 4, the driver 51 disposed in the plate-shaped member 10 includes a plurality of conductive regions (conductive lines) 510. The plurality of conductive regions 510 include individual conductive regions 510i and a common conductive region 510c. Each of the individual conductive regions 510i is a conductive region 510 electrically connected to a corresponding one of the heater electrodes 500 through a via 53. The common conductive region 510c is a conductive region 510 electrically connected to the plurality of heater electrodes 500 through vias 53. In the example shown in FIG. 4, the common conductive region 510c is electrically connected to all the six heater electrodes 500.

As shown in FIG. 2, the lower part of FIG. 4, and FIG. 5, a plurality of terminal holes Ht are formed in the electrostatic chuck 100. As shown in FIG. 5, each of the terminal holes Ht is a continuous hole formed by a first through hole 22, a second through hole 32, and a recess 12 which communicate with one another. The first through hole 22 extends through the base member 20 from the upper surface S3 to the lower surface S4. The second through hole 32 extends through the bonding portion 30 in the vertical direction. The recess 12 is formed on the lower surface S2 side of the plate-shaped member 10. A cross section of each terminal hole Ht which is orthogonal to its extending direction may have any shape and has, for example, a circular, rectangular, or fan shape. A plurality of electricity supply pads 70 made of a conductive material are formed on the lower surface S2 of the plate-shaped member 10 at positions corresponding to the terminal holes Ht (positions overlapping the terminal holes Ht in the Z axis direction). Each of the electricity supply pads 70 is electrically connected to a corresponding one of the conductive regions 510 (the individual conductive regions 510i and the common conductive region 510c) of the driver 51 through a via 54.

A plurality of electricity supply terminals 72 formed of a conductive material are received in each of the terminal holes Ht. Each electricity supply terminal 72 has a base portion 74 and a rod-shaped portion 76 extending from the base portion 74. The base portion 74 of each electricity supply terminal 72 is joined to a corresponding electricity supply pad 70 by brazing using, for example, a brazing material 78.

In each terminal hole Ht, the electricity supply terminals 72 are received in respective recesses 91 formed in an insulating member 90 having a connector shape. Specifically, the plurality of electricity supply terminals 72 received in one terminal hole Ht are arranged in plane directions with the insulating member 90 therebetween and are insulated from one another by the insulating member 90. The electricity supply terminals 72 may or may not be in contact with the insulating member 90. Each of the electricity supply terminals 72 is electrically connected to a wiring line (e.g., a jumper wire) 80 connected to a power source PS (FIG. 2). The insulating member 90 is formed of, for example, a heat resistant resin (such as a polyimide resin, an epoxy resin, or a polyether ether ketone resin). In the present embodiment, each recess 91 in the insulating member 90 is formed such that the recess 91 surrounds one electricity supply terminal 72 and one electricity supply pad 70 together. In the present embodiment, the insulating member 90 interposed between the plurality of electricity supply terminals 72 received in one terminal hole Ht is formed as a single member.

In the present embodiment, the plurality of electricity supply terminals 72 provided in the electrostatic chuck 100 include individual electricity supply terminals 72i and common electricity supply terminals 72c. Each individual electricity supply terminal 72i is an electricity supply terminal 72 electrically connected to one heater electrode 500 through an electricity supply pad 70, a via 54, an individual conductive region 510i of the driver 51, and a via 53. Each common electricity supply terminal 72c is an electricity supply terminal 72 electrically connected to the plurality of heater electrodes 500 through an electricity supply pad 70, a via 54, the common conductive region 510c of the driver 51, and vias 53. Specifically, in the electrostatic chuck 100 of the present embodiment, first ends of the plurality of heater electrodes 500 are electrically connected different individual electricity supply terminals 72i, and second ends of the plurality of heater electrodes 500 are electrically connected to (one or a plurality of) the common electricity supply terminals 72c.

More specifically, the plurality of electricity supply terminals 72 provided in the electrostatic chuck 100 include: N individual electricity supply terminals 72i (N=3 in the example shown in FIG. 4) electrically connected to respective N heater electrodes 500 disposed in respective N segments SE forming one upper level segment SEb; and the common electricity supply terminals 72c electrically connected to all the N heater electrodes 500. For example, three electricity supply terminals 72 received in the leftmost one of three terminal holes Ht shown in the lower part of FIG. 4 are three individual electricity supply terminals 72i electrically connected to respective three heater electrodes 500 disposed in respective three segments SE forming one upper level segment SEb. Similarly, three electricity supply terminals 72 received in the rightmost terminal hole Ht are three individual electricity supply terminals 72i electrically connected to respective three heater electrodes 500 disposed in respective three segments SE forming another upper level segment SEb. Three electricity supply terminals 72 received in the central terminal hole Ht are the common electricity supply terminals 72c electrically connected to all three heater electrodes 500 disposed in respective three segments SE forming the one upper level segment SEb. In the present embodiment, the three electricity supply terminals 72 received in the central terminal hole Ht also serve as the common electricity supply terminals 72c electrically connected to all three heater electrodes 500 disposed in respective three segments SE forming the other upper level segment SEb.

As shown in FIG. 4, individual electricity supply terminals 72i are received in one terminal hole Ht in which the common electricity supply terminals 72c are not received. More specifically, N individual electricity supply terminals 72i (N=3 in the example shown in FIG. 4) electrically connected to respective N heater electrodes 500 disposed in respective N segments SE forming one upper level segment SEb are received in one terminal hole Ht in which the common electricity supply terminals 72c are not received. In the example shown in FIG. 4, three individual electricity supply terminals 72i electrically connected to respective three heater electrodes 500 disposed in respective three segments SE forming one upper level segment SEb are received in the leftmost terminal hole Ht, and the common electricity supply terminals 72c are not received in this terminal hole Ht. Similarly, three individual electricity supply terminals 72i electrically connected to respective three heater electrodes 500 disposed in respective three segments SE forming another upper level segment SEb are received in the rightmost terminal hole Ht, and the common electricity supply terminals 72c are not received in this terminal hole Ht.

As shown in FIG. 4, the common electricity supply terminals 72c are received in a terminal hole Ht in which the individual electricity supply terminals 72i are not received. In the example shown in FIG. 4, the three (i.e., N) common electricity supply terminals 72c are received in the central terminal hole Ht, and the individual electricity supply terminals 72i are not received in this terminal hole Ht.

In the present embodiment, the plurality of individual electricity supply terminals 72i received in each terminal hole Ht are insulated from one another by an insulating member 90, and the plurality of common electricity supply terminals 72c received in one terminal holes Ht are insulated from one another by an insulating member 90.

In the electrostatic chuck 100 having the above structure, when voltages are applied to the heater electrodes 500 from the power source PS through the wiring lines 80, the electricity supply terminals 72 (the individual electricity supply terminals 72i and the common electricity supply terminals 72c), the electricity supply pads 70, the vias 54, the conductive regions 510 (the individual conductive regions 510i and the common conductive region 510c) of the driver 51, and the vias 53, the heater electrodes 500 generate heat. The segments SE in which the heater electrodes 500 are disposed are thereby heated, and control of the distribution of temperature on the attracting surface S1 of the plate-shaped member 10 (and control of the distribution of temperature in the wafer W held on the attracting surface S1 of the plate-shaped member 10) is achieved. In the present embodiment, the potential of the common electricity supply terminals 72c during application of the voltages to the heater electrodes 500 is maintained at a reference potential (ground potential).

In the electrostatic chuck 100 of the present embodiment, the power source PS can be switched between a state (hereinafter referred to as a "first state") in which individually set voltages are applied to respective individual electricity supply terminals 72i (three terminals in the example shown in FIG. 4) received in one terminal hole Ht and a state (hereinafter referred to as a "second state") in which the same voltage is applied to the plurality of (three) individual electricity supply terminals 72i received in the one terminal hole Ht. When the power source PS is switched to the first state, the amount of heat generated by the heater electrodes 500 can be controlled on a heater electrode 500-by-heater electrode 500 basis (i.e., on a segment SE-by-segment SE basis), and the distribution of the temperature on the attracting surface S1 of the plate-shaped member 10 can be controlled on a segment SE-by-segment SE basis (i.e., the temperature distribution can be controlled more finely). When the power source PS is switched to the second state, the amount of heat generated by the heater electrodes 500 can be controlled for each group of heater electrodes 500 electrically connected to respective individual electricity supply terminals 72i received in one terminal hole Ht (i.e., on an upper level segment SEb-by-upper level segment SEb basis). Therefore, the distribution of the temperature on the attracting surface S1 of the plate-shaped member 10 can be controlled on an upper level segment SEb-by-upper level segment SEb basis (i.e., the temperature distribution can be controlled coarsely).

Preferably, in each upper level segment SEb including a plurality of segments SE having respective surfaces included in the attracting surface S1, the amount of heat generated by a heater electrode 500 disposed in one segment SE per unit area of the surface of the one segment SE (a region of the attracting surface S1 which belongs to the one segment SE) (the amount of heat is hereinafter referred to as the "amount of heat generation per unit segment area") is approximately the same as the amount of heat generated by a heater electrode 500 disposed in another segment SE per unit area of the surface of the other segment SE (the amount of heat generation per unit segment area). More preferably, in one upper level segment SEb including a plurality of segments SE, the amounts of heat generated by the heater electrodes 500 per unit segment area are approximately the same. In the present description, the phrase "two values are approximately the same" means that the larger one of the two values is equal to or less than 110% of the smaller one.

In the case where the area of the surface (forming the attracting surface S1) of one segment SE included in the upper level segments SEb is approximately the same as the area of the surface (forming the attracting surface S1) of another segment SE included in the one upper level segment SEb, when the resistance value of the heater electrode 500 disposed in the one segment SE is approximately the same as the resistance value of the heater electrode 500 disposed in the other segment SE, the amounts of heat generated by the two heater electrodes 500 per unit segment area become approximately the same. In the case where the area of the surface (forming the attracting surface S1) of the one segment SE is larger than the area of the surface (forming the attracting surface S1) of the other segment SE, when the resistance value of the heater electrode 500 disposed in the one segment SE is larger than the resistance value of the heater electrode 500 disposed in the other segment SE by an amount corresponding to the area ratio of the two segments SE, the amounts of heat generated by the two heater electrodes 500 per unit segment area are approximately the same.

A-3. Effects of Present Embodiment

As described above, the electrostatic chuck 100 of the first embodiment includes the plate-shaped member 10 and the base member 20. The plate-shaped member 10 has the approximately flat attracting surface S1 approximately orthogonal to the Z-axis direction and the lower surface S2 opposite to the attracting surface S1. The base member 20 has the upper surface S3 and the lower surface S4 opposite to the upper surface S3 and is disposed such that the upper surface S3 faces the lower surface S2 of the plate-shaped member 10. The base member 20 has the plurality of first through holes 22 formed so as to extend from the upper surface S3 to the lower surface S4. The electrostatic chuck 100 of the first embodiment further includes the plurality of heater electrodes 500 disposed in the plate-shaped member 10 and each formed from a resistance heating element, the plurality of electricity supply terminals 72 electrically connected to the heater electrodes 500, and the bonding portion 30 which is disposed between the lower surface S2 of the plate-shaped member 10 and the upper surface S3 of the base member 20 and bonds the plate-shaped member 10 and the base member 20 together. The bonding portion 30 has the plurality of second through holes 32 which are in communication with the respective first through holes 22 of the base member 20 and form, in cooperation with the first through holes 22, the respective terminal holes Ht receiving the electricity supply terminals 72. The electrostatic chuck 100 of the first embodiment further includes the insulating members 90 received in the terminal holes Ht. The plurality of electricity supply terminals 72 included in the electrostatic chuck 100 include N individual electricity supply terminals 72i (N is an integer of 2 or more, and N=3 in the example shown in FIG. 4. The same applies to the following description.) electrically connected to respective N heater electrodes 500 of the plurality of heater electrodes 500 and the common electricity supply terminals 72c electrically connected to all the N heater electrodes 500. The N individual electricity supply terminals 72i are received in one terminal hole Ht with no common electricity supply terminals 72c received therein and are insulated from one another by an insulating member 90, and the common electricity supply terminals 72c are received in another terminal hole Ht with no individual electricity supply terminals 72i received therein.

During application of voltages to the heater electrodes 500, the potential of the common electricity supply terminals 72c is maintained at the predetermined reference potential (ground potential), but the potentials of the individual electricity supply terminals 72i are set to values corresponding to the amounts of heat to be generated by the respective heater electrodes 500 electrically connected to the respective individual electricity supply terminals 72i. Therefore, although the differences in potential between the common electricity supply terminals 72c and the individual electricity supply terminals 72i are relatively large, the differences in potential between the individual electricity supply terminals 72i are much smaller than the differences in potential between the common electricity supply terminals 72c and the individual electricity supply terminals 72i. As described above, in the electrostatic chuck 100 of the first embodiment, N individual electricity supply terminals 72i are received in one terminal hole Ht in which the common electricity supply terminals 72c are not received, and the common electricity supply terminals 72c are received in another terminal hole Ht in which the individual electricity supply terminals 72i are not received. Therefore, in the electrostatic chuck 100 of the first embodiment, the differences in potential between electricity supply terminals 72 received in one terminal hole Ht can be reduced. The physical distances between the electricity supply terminals 72 can thereby be reduced, and the size of the insulating member 90 disposed between the electricity supply terminals 72 can be reduced, so that the size of the terminal holes Ht can be reduced.

Portions of the plate-shaped member 10 which overlap the terminal holes Ht when viewed in the Z axis direction tend to act as temperature singularities, because these overlapping portions differ from the remaining portion of the plate-shaped member 10 in terms of the conditions regarding the heat transfer between the plate-shaped member 10 and the base member 20. Therefore, as the size of the terminal holes Ht increases, the size of the temperature singularities in the plate-shaped member 10 increases, and this may cause a reduction in controllability of the distribution of temperature on the attracting surface S1 of the plate-shaped member 10 (and thus the controllability of the distribution of temperature in the wafer W held by the electrostatic chuck 100). As described above, in the electrostatic chuck 100 of the first embodiment, although the structure in which a plurality of electricity supply terminals 72 are received in one terminal holes Ht is employed, the size of the terminal holes Ht can be reduced, so that the temperature singularities in the plate-shaped member 10 can be reduced in size. Therefore, it is possible to improve the controllability of the distribution of the temperature on the attracting surface S1 of the plate-shaped member 10 (and thus the controllability of the distribution of the temperature in the wafer W held by the electrostatic chuck 100).

In the electrostatic chuck 100 of the first embodiment, at least part of the plate-shaped member 10 is virtually divided into the plurality of segments SE arranged in directions (plane directions) orthogonal to the Z-axis direction, and the plurality of heater electrodes 500 are disposed in their respective segments SE. N segments (N=3 in the example shown in FIG. 4) in which respective N heater electrodes 500 are disposed form one continuous upper level segment SEb. Therefore, in the electrostatic chuck 100 of the first embodiment, control of the distribution of the temperature on the attracting surface S1 on a segment SE-by-segment SE basis (i.e., finer temperature distribution control) and also control of the distribution of the temperature on the attracting surface S1 of the plate-shaped member on an upper level segment SEb-by-upper level segment SEb basis (i.e., coarser temperature distribution control) can be achieved using the same structure, so that the convenience of the electrostatic chuck 100 can be improved.

The electrostatic chuck 100 of the first embodiment further includes the power source PS. The power source PS can be switched between the first state in which individually set voltages are applied to respective N individual electricity supply terminals 72i (N=3 in the example shown in FIG. 4) and the second state in which the same voltage is applied to the N individual electricity supply terminals 72i. Therefore, in the electrostatic chuck 100 of the first embodiment, the amounts of heat generated by the N heater electrodes 500 can be controlled independently, and the amounts of heat generated by the N heater electrodes 500 can be controlled collectively, so that the convenience of the electrostatic chuck 100 can be further improved.

In the electrostatic chuck 100 of the first embodiment, the plurality of electricity supply terminals 72 included in the electrostatic chuck 100 include N common electricity supply terminals 72c received in one terminal hole Ht. Therefore, the difference between the size of the terminal hole Ht which receives the N individual electricity supply terminals 72i and the size of the terminal hole Ht which receives the N common electricity supply terminals 72c can be reduced, so that an increase in temperature variations on the attracting surface S1 of the plate-shaped member 10 due to the difference in size between the terminal holes Ht can be effectively prevented. As described above, the portions of the attracting surface S1 of the plate-shaped member 10 which overlap the terminal holes Ht when viewed in the Z axis direction tend to act as temperature singularities. Therefore, in the portions of the plate-shaped member 10 which overlap the terminal holes Ht when viewed in the Z axis direction (and their peripheral portions), the heater electrodes 500 require a special design which differs from the design of the heater electrodes 500 in other portions. Therefore, it is preferable that the shapes of the terminal holes Ht are the same or close to one another, and accordingly, it is preferable that the numbers of electricity supply terminals 72 received in the terminal holes Ht are the same or close to one another. In the electrostatic chuck 100 of the first embodiment, since the plurality of electricity supply terminals 72 included in the electrostatic chuck 100 include the N common electricity supply terminals 72c received in one terminal hole Ht, it is easily possible that the shape of the terminal holes Ht each receiving N individual electricity supply terminals 72i can be the same as or close to the shape of the terminal hole Ht receiving the N common electricity supply terminals 72c. Therefore, the special shape of heater electrodes 500 in portions of the plate-shaped member 10 which overlap the terminal holes Ht each receiving N individual electricity supply terminals 72i when viewed in the Z axis direction can be the same as or close to the special shape of heater electrodes 500 in a portion which overlaps the terminal hole Ht which receives the N common electricity supply terminals 72c. Therefore, it is possible to easily improve the uniformity of the distribution of the temperature on the attracting surface S1 of the plate-shaped member 10.

In the electrostatic chuck 100 of the first embodiment, it is preferable that, in each upper level segment SEb including a plurality of segments SE having respective surfaces included in the attracting surface S1, the amount of heat generated by a heater electrode 500 disposed in one segment SE per unit area of the surface of the one segment SE (the amount of heat generation per unit segment area) is approximately the same as the amount of heat generated by a heater electrode 500 disposed in another segment SE per unit area of the surface of the other segment SE (the amount of heat generation per unit segment area). In this structure, when the same voltage is applied to the two heater electrodes 500, regions of the attracting surface S1 which belong to the respective two segments SE in one upper level segment SEb can have approximately the same temperature, and the uniformity of the distribution of the temperature in the regions of the attracting surface S1 which belong to the upper level segment SEb can be improved. More preferably, the amounts of heat generated per unit segment area by heater electrodes 500 in a plurality of segments SE included in each upper level segment SEb are approximately the same. In this structure, when the same voltage is applied to the heater electrodes 500, all regions of the attracting surface S1 which belong to the segments SE included in one upper level segment SEb can have approximately the same temperature, and the uniformity of the distribution of the temperature in the regions of the attracting surface S1 which belong to the upper level segment SEb can be effectively improved.

B. Second Embodiment

Figure 7:
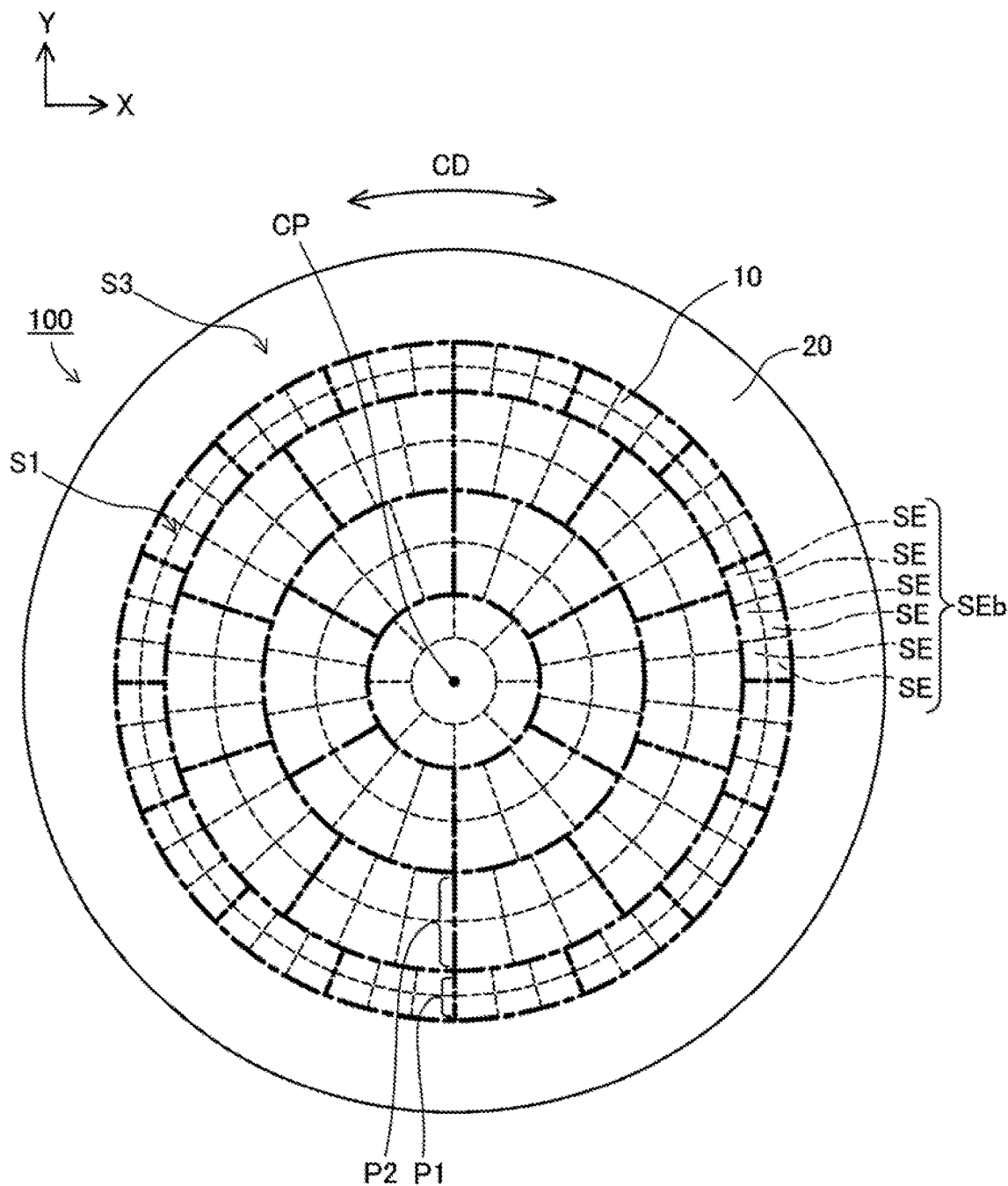
FIG. 7 is an illustration schematically showing an XY plane (upper surface) structure of an electrostatic chuck 100 according to a second embodiment.

FIG. 7 is an illustration schematically showing an XY plane (upper surface) structure of an electrostatic chuck 100 according to a second embodiment. In the following description, among the components of the electrostatic chuck 100 of the second embodiment, the same components as those of the electrostatic chuck 100 of the first embodiment described above are denoted by the same reference numerals, and their description will be appropriately omitted.

As shown in FIG. 7, the electrostatic chuck 100 of the second embodiment differs from the electrostatic chuck 100 of the first embodiment in the forms of the segments SE and the upper level segments SEb in the plate-shaped member 10. Specifically, in the electrostatic chuck 100 of the second embodiment, the area of each of the segments SE in a first portion P1 (e.g., the outermost portion) of the plate-shaped member 10 is smaller than the area of each of the segments SE in a second portion P2 closer to the center point CP than the first portion P1 when viewed in the Z axis direction (e.g., a portion adjacently located on the inner side of the first portion P1 when viewed in the Z axis direction).

In the electrostatic chuck 100 of the second embodiment, all the upper level segments SEb except for the upper level segment SEb located at the center point CP of the attracting surface S1 each include six segments SE. Therefore, six individual electricity supply terminals 72*i* electrically connected to respective six heater electrodes 500 disposed in respective six segments SE forming one upper level segment SEb are received in one terminal hole Ht.

As described above, portions of the plate-shaped member 10 which overlap the terminal holes Ht when viewed in the Z axis direction tend to act as temperature singularities. Therefore, in the portions of the plate-shaped member 10 which overlap the terminal holes Ht when viewed in the Z axis direction (and their peripheral portions), the heater electrodes 500 require a special design which differs from the design of the heater electrodes 500 in other portions. Therefore, it is preferable that the shapes of the terminal holes Ht are the same or close to one another, and accordingly, it is preferable that the numbers of electricity supply terminals 72 received in the terminal holes Ht are the same or close to one another. The first portion P1 of the plate-shaped member 10 is more easily affected by the temperature of the outside than the second portion P2 which is closer to the center point CP of the plate-shaped member 10 than the first portion P1. Therefore, to achieve finer temperature distribution control, it is preferable to reduce the areas of the upper level segments SEb in the first portion P1.

As described above, in the electrostatic chuck 100 of the second embodiment, the area of each of the segments SE in the first portion P1 of the plate-shaped member 10 is smaller than that in the second portion P2. Therefore, the area of each of the upper level segments SEb in the first portion P1 can be reduced while the number of segments SE included in each of the upper level segments SEb in the first portion P1 is set to be the same as or close to the number of segments SE in each of the upper level segments SEb in the second portion P2 (i.e., the number of individual electricity supply terminals 72*i* received in one terminal hole Ht corresponding to an upper level segment SEb in the first portion P1 is set to be the same as or close to the number of individual electricity supply terminals 72*i* received in one terminal hole Ht corresponding to an upper level segment SEb in the second portion P2). Therefore, in the electrostatic chuck 100 of the second embodiment, the shapes of the terminal holes Ht can be rendered the same or close to one another by determining the numbers of electricity supply terminals 72 received in the terminal holes Ht to be the same or close to one another, and simultaneously, the controllability of the distribution of the temperature on the attracting surface S1 of the plate-shaped member 10 (and the controllability of the distribution of the temperature in the wafer W held by the electrostatic chuck 100) can be further improved by reducing the area of the upper level segments SEb in the first portion P1.

C. Modifications

The technique disclosed in the present description is not limited to the embodiments described above and may be modified into various forms without departing from the scope of the invention. For example, the following modifications are possible.

The structures of the electrostatic chucks 100 of the above embodiments are merely examples and can be modified variously. For example, in the above embodiments, one end of each heater electrode 500 is electrically connected to the three common electricity supply terminals 72*c*. However, the number of the common electricity supply terminals 72*c* electrically connected to each heater electrode 500 may be two or less and four or more.

In the above embodiments, one end of each heater electrode 500 is electrically connected to N common electricity supply terminals 72*c* (N=3 in the example shown in FIG. 4), and the N common electricity supply terminals 72*c* are received in one terminal hole Ht. In this structure, a part of the N common electricity supply terminals 72*c* may be received in one terminal hole Ht, and another part of the N common electricity supply terminals 72*c* may be received in another terminal hole Ht. In this case also, it is preferable that a plurality of common electricity supply terminals 72*c* are received in one terminal hole Ht in order to prevent an increase in temperature variations on the attracting surface S1 of the plate-shaped member 10 due to the difference in size between the terminal holes Ht.

In the above embodiments, the number of individual electricity supply terminals 72*i* received in one terminal hole Ht is the same as the number of segments SE included in one upper level segment SEb, but they need not necessarily be the same. Specifically, it is only necessary that, irrespective of the number of segments SE included in one upper level segment SEb, the plurality of electricity supply terminals 72 provided in the electrostatic chuck 100 include N individual electricity supply terminals 72*i* (N is an integer of 2 or more) electrically connected to respective N heater electrodes 500 and the common electricity supply terminals 72*c* connected to all the N heater electrodes 500, that the N individual electricity supply terminals 72*i* be received in one terminal hole Ht in which the common electricity supply terminals 72*c* are not received, and that the common electricity supply terminals 72*c* are received in another terminal hole Ht in which the individual electricity supply terminals 72*i* are not received.

In the above embodiments, as for the position of the driver 51 in the Z axis direction, the entire driver 51 is located at the same position (i.e., the driver 51 has a single layer structure). However, part of the driver 51 may be located at a different position (i.e., the driver 51 may have a multilayer structure). In the above embodiments, the heater electrodes 500 are electrically connected to the respective electricity supply terminals 72 through the driver 51. However, the heater electrodes 500 may be electrically connected to the respective electricity supply terminals 72 without the driver 51 interposed therebetween.

The structure of the insulating members 90 in the above embodiments is merely an example and can be changed variously. For example, in the above embodiments, each insulating member 90 is shaped to face the corresponding recess 12 of the plate-shaped member 10, the corresponding second through hole 32 of the bonding portion 30, and the corresponding first through hole 22 of the base member 20 in the plane directions (see FIG. 5). However, it is only necessary that each insulating member 90 is shaped to face at least the corresponding first through hole 22 of the base member 20. In the above embodiments, each insulating member 90 interposed between a plurality of electricity supply terminals 72a received in one terminal hole Ht is formed as a single member. However, separate insulating members may be disposed between a plurality of electricity supply terminals 72 received in one terminal hole Ht. In the above embodiments, each insulating member is integrated with wiring lines. However, the insulating member may be disposed separately from the wiring lines. The insulating member used may be an insulating material such as a resin filled between the plurality of electricity supply terminals 72. It is also preferable that a plurality of electricity supply pads 70 received in one terminal hole Ht are insulated from one another by the insulating member.

The structure of the electricity supply terminals 72 in the above embodiments is merely an example and can be modified variously. For example, the electricity supply terminals 72 may be formed using a flexible printed circuit (FPC) board or a mount connector.

The setting mode of the segments SE in the above embodiments (the number of segments SE, the shape of the segments SE, etc.) and the setting mode of the upper level segments SEb (the number of upper level segments SEb, the number of segments SE included in each upper level segment SEb, etc.) can be freely changed. For example, in the above embodiments, the plurality of segments SE are set so as to be arranged in the circumferential direction CD of the attracting surface S1. However, the plurality of segments SE may be set so as to be arranged in a lattice. For example, in the above embodiments, the entire electrostatic chuck 100 is virtually divided into the plurality of segments SE. However, part of the electrostatic chuck 100 may be virtually divided into a plurality of segments SE. In the electrostatic chuck 100, the segments SE and the upper level segments SEb need not necessarily be set.

In a structure in which a very large number of (e.g., 100 or more) segments SE are set in the plate-shaped member 10, the number of heater electrodes 500 disposed in the plate-shaped member 10 is very large, and the number of electricity supply terminals 72 used to supply electricity to the heater electrodes 500 is also very large. Therefore, the number of terminal holes Ht and the number of electricity supply terminals 72 received in each terminal hole Ht tend to be very large. The present invention is particularly effective for such a structure.

The materials forming the components (such as the plate-shaped member 10, the base member 20, and the bonding portion 30) of the electrostatic chuck 100 in each of the embodiments are merely examples and can be changed variously.

In the above embodiments, each via may be composed of a single via or may be composed of a group of a plurality of vias. In the above embodiments, each via may have a single layer structure including only a via portion or may have a multi-layer structure (e.g., a structure including a via portion, a pad portion, and a via portion stacked one on another).

In the above embodiments, a single-pole type in which one chuck electrode 40 is disposed inside the plate-shaped member 10 is used, but a double-pole type in which a pair of chuck electrodes 40 are disposed inside the plate-shaped member 10 may be used. The materials forming the members of the electrostatic chuck 100 in each of the above embodiments are merely examples, and these members may be formed from other materials.

The present invention is not limited to the electrostatic chuck 100 which includes the plate-shaped member 10 and the base member 20 and uses electrostatic attraction to hold the wafer W. The invention is applicable to another holding device (such as a heater such as a CVD heater or a vacuum chuck) which includes a plate-shaped member, a base member, a bonding portion for bonding the plate-shaped member and the base member together, a plurality of heater electrodes disposed in the plate-shaped member, and a plurality of electricity supply terminals electrically connected to the heater electrodes and which holds an object on the surface of the plate-shaped member.

DESCRIPTION OF REFERENCE NUMERALS

10: plate-shaped member 12: recess 20: base member 21: coolant channel 22: first through hole 30: bonding portion 32: second through hole 40: chuck electrode 50: heater electrode layer 51: driver 53: via 54: via 70: electricity supply pad 72: electricity supply terminal 72c: common electricity supply terminal 72i: individual electricity supply terminal 74: base portion 76: rod-shaped portion 78: brazing material 80: wiring line 90: insulating member 91: recess 100: electrostatic chuck 500: heater electrode 502: heater line portion 504: heater pad portion 510: conductive region 510c: common conductive region 510i: individual conductive region BL1: first boundary line BL2: second boundary line CD: circumferential direction CP: center point Ht: terminal hole P1: first portion P2: second portion PS: power source RD: radial direction S1: attracting surface S2: lower surface S3: upper surface S4: lower surface SE: segment SEb: upper level segment W: wafer

The invention claimed is:
1. A holding device comprising:
a plate-shaped member having an approximately flat first surface approximately orthogonal to a first direction and a second surface opposite to the first surface;
a base member having a third surface and a fourth surface opposite to the third surface, the base member being disposed such that the third surface faces the second surface of the plate-shaped member, the base member having a plurality of first through holes extending from the third surface to the fourth surface;
a plurality of heating elements disposed in the plate-shaped member;

a plurality of electricity supply terminals electrically connected to the respective heating elements;

a bonding portion disposed between the second surface of the plate-shaped member and the third surface of the base member to bond the plate-shaped member and the base member together, the bonding portion having a plurality of second through holes which communicate with the respective first through holes of the base member and form, in cooperation with the first through holes, terminal holes for receiving the electricity supply terminals; and insulating members received in the respective terminal holes, the holding device holding an object on the first surface of the plate-shaped member, wherein the plurality of electricity supply terminals include N individual electricity supply terminals (N is an integer of 2 or more) electrically connected to respective N heating elements of the plurality of heating elements, and a common electricity supply terminal electrically connected to all the N heating elements;

the N individual electricity supply terminals are received in a first one of the terminal holes and are insulated from one another by one of the insulating members, the first one of the terminal holes not receiving the common electricity supply terminal; and the common electricity supply terminal is received in a second one of the terminal holes, the second one of the terminal holes not receiving the individual electricity supply terminals.

2. A holding device according to claim 1, wherein at least part of the plate-shaped member is virtually divided into a plurality of segments arranged in directions orthogonal to the first direction; the plurality of heating elements are disposed in the respective segments; and N segments of the plurality of segments in which the respective N heating elements are disposed form one continuous upper level segment.

3. A holding device according to claim 2, wherein, when the holding device is viewed in the first direction, the area of each segment in a first portion of the plate-shaped member is smaller than the area of each segment in a second portion of the plate-shaped member which is closer to the center of the plate-shaped member than the first portion.

4. A holding device according to claim 2, wherein the segments included in the one upper level segment have respective surfaces included in the first surface; a first heating element of the plurality heating elements is disposed in a first one of the segments included in the one upper level segment; a second heating element of the plurality heating elements is disposed in a second one of the segments included in the one upper level segment; and the amount of heat generated by the first heating element per unit area of the surface of the first one of the segments is approximately the same as the amount of heat generated by the second heating element per unit area of the surface of the second one of the segments.

5. A holding device according to claim 4, wherein, in the one upper level segment including the N segments having the respective surfaces included in the first surface, the amounts of heat generated by the heating elements disposed in the respective N segments per unit area of the respective surfaces of the N segments are approximately the same.

6. A holding device according to claim 1, further comprising a power source which can be switched between a first state in which individually set voltages are applied to the respective N individual electricity supply terminals and a second state in which the same voltage is applied to the N individual electricity supply terminals.

7. A holding device according to claim 1,
wherein the plurality of electricity supply terminals include a plurality of the common electricity supply terminals received in the second one of the terminal holes.

8. A holding device according to claim 7, wherein the plurality of electricity supply terminals include the common electricity supply terminals which are received in the second one of the terminal holes and the number of which is N.

* * * * *